US008674509B2

(12) United States Patent
Carpenter et al.

(10) Patent No.: US 8,674,509 B2
(45) Date of Patent: Mar. 18, 2014

(54) INTEGRATED CIRCUIT DIE ASSEMBLY WITH HEAT SPREADER

(75) Inventors: Burton J. Carpenter, Austin, TX (US); Leo M. Higgins, III, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/485,912

(22) Filed: May 31, 2012

(65) Prior Publication Data

US 2013/0320548 A1  Dec. 5, 2013

(51) Int. Cl.
*H01L 23/48* (2006.01)

(52) U.S. Cl.
USPC ........... 257/772; 257/678; 257/701; 257/718; 257/717; 257/720

(58) Field of Classification Search
USPC .................. 257/678, 701, 718, 717, 720, 772
See application file for complete search history.

(56) References Cited

U.S. PATENT DOCUMENTS

| | | | |
|---|---|---|---|
| 6,146,921 A * | 11/2000 | Barrow | 438/122 |
| 6,972,216 B2 * | 12/2005 | Huang et al. | 438/122 |
| 7,196,415 B2 | 3/2007 | Zhong et al. | |
| 7,781,882 B2 | 8/2010 | Zhong et al. | |
| 7,859,101 B2 | 12/2010 | Zhao et al. | |
| 7,892,882 B2 * | 2/2011 | Leal et al. | 438/106 |
| 2003/0178132 A1 * | 9/2003 | Shinozaki | 156/275.5 |
| 2010/0041181 A1 * | 2/2010 | Huang et al. | 438/113 |
| 2010/0171201 A1 * | 7/2010 | Wyant et al. | 257/676 |
| 2010/0200160 A1 * | 8/2010 | Kumakura | 156/325 |
| 2010/0270663 A1 * | 10/2010 | Johnston et al. | 257/666 |
| 2011/0036913 A1 * | 2/2011 | Merz et al. | 235/492 |
| 2011/0092027 A1 * | 4/2011 | Li | 438/122 |
| 2011/0115074 A1 * | 5/2011 | Hu et al. | 257/737 |
| 2011/0176279 A1 * | 7/2011 | Zhao et al. | 361/720 |
| 2012/0282739 A1 * | 11/2012 | Brunschwiler et al. | 438/127 |

* cited by examiner

*Primary Examiner* — Bac H. Au
*Assistant Examiner* — Sophia Nguyen
(74) *Attorney, Agent, or Firm* — Mary Jo Bertani; Joanna G. Chiu (57) ABSTRACT

A packaged semiconductor device comprises a package substrate comprising a first package substrate contact and a second package substrate contact, and a semiconductor die over the package substrate. The semiconductor device further includes electrical connections between signal contact pads of the die and the package substrate, and a heat spreader that comprises a first heat spreader portion which is electrically connected to a first signal contact pad and the first package substrate contact and provides an electrical conduction path and a thermal conduction path. A second heat spreader portion provides an electrical conduction path between a second signal contact pad and the second package substrate contact and a thermal conduction path between the die and package substrate. An insulating layer is positioned between the first and second heat spreader portions.

16 Claims, 6 Drawing Sheets

INTEGRATED CIRCUIT DIE ASSEMBLY WITH HEAT SPREADER

BACKGROUND

1. Field

This disclosure relates generally to semiconductor devices, and more specifically, to a method of forming a semiconductor package with a heat spreader.

2. Related Art

Heat is generated by an integrated circuit (IC) die during operation. If inadequately removed, the heat generated by the die may cause the device to fail or to perform erratically. As such, heat spreaders are often incorporated into semiconductor packages to improve the thermal performance of the IC. Additionally, with ever-increasing demand for processing capability at decreased size and cost, options for supplying stable power to the semiconductor die become more limited.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and assemblies disclosed herein provide a laminated heat spreader with an outer thermal layer for heat dissipation and ground and an inner conductive layer that supply power to a semiconductor die as well as aiding heat dissipation. An insulating material separates the ground/heat dissipation layer from the power layer. The ground/heat dissipation layer completely overlays the power layer and thus stabilizes the power supply with substantial capacitive coupling through the insulating material. The improved stability of the power supply and the higher amount of heat dissipated by the laminated heat spreader enables higher frequency operation and/or reduced space requirements for the semiconductor die.

Figure 1:
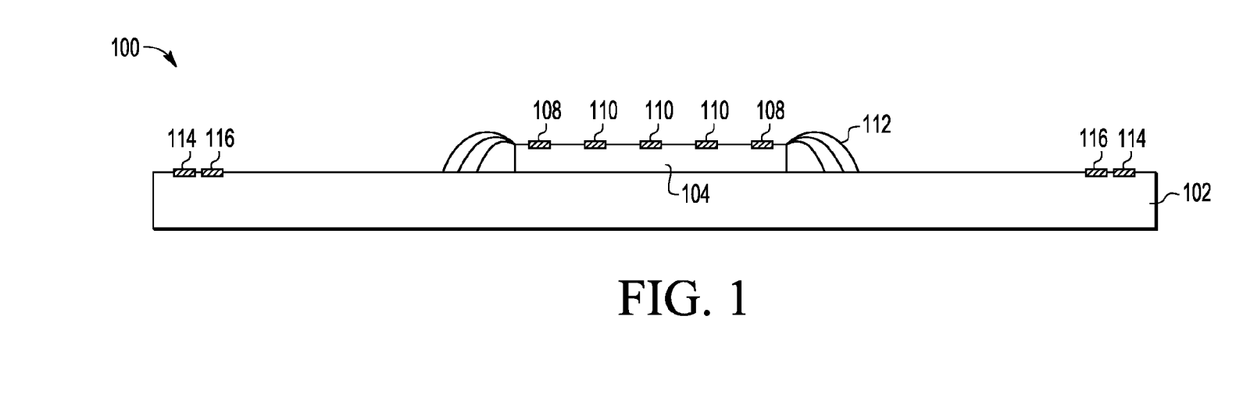
FIG. 1 shows an embodiment of a semiconductor device during an intermediate stage of manufacture in accordance with the present invention.

FIG. 1 shows an embodiment of a semiconductor device 100 during an intermediate stage of manufacture in accordance with the present invention including package substrate 102, and semiconductor die 104 with power contacts 108 and ground contacts 110 attached to semiconductor die 104. Power contacts 108 are placed around an outer perimeter of the top surface of die 104 and ground contacts 110 are placed on an inner portion of the top surface of die 104. Wire bonds 112 are formed between contacts (not shown) on the top surface of die 104 and contacts (not shown) on the top surface of substrate 102. Ground contacts 114 are formed on an outer perimeter of the top surface of substrate 102. Power contacts 116 are also formed on the top surface of substrate 102 adjacent to ground contacts 114 closer to die 104 than ground contacts 114. Ground contacts 110, 114 conduct a first electrical signal, such as Vss. Power contacts 108, 116 conduct a second electrical signal, such as Vdd. Other suitable electrical signals can be conducted by contacts 110, 114 and contacts 108, 116, with the signal conducted by contacts 110, 114 being different than the signal conducted by contacts 108, 116.

Die 104 can be a flip chip or a wire bond die. The substrate 102 can be a lead frame or other type of semiconductor packaging substrate. The IC die 104 can be attached using a layer of die attach material (not shown) such as an adhesive paste or film. While FIG. 1 shows only a single die assembly 100 for purposes of simplicity, it is understood that the die assembly described herein may be applied to an array of die assemblies formed on a lead frame or other type of substrate array.

In configurations where a flip chip form factor is used instead of the wire bond die 102 shown, electrical interconnects can be established by bumps (not shown) on the flip chip die (not shown) that contact electrical contacts (not shown) on substrate 102. Other suitable techniques for establishing electrical interconnectivity between die 104 and substrate 102 can be used. Power contacts 108 and ground contacts 110 may be connected to through silicon vias (TSV) within semiconductor die 104.

Figure 2:
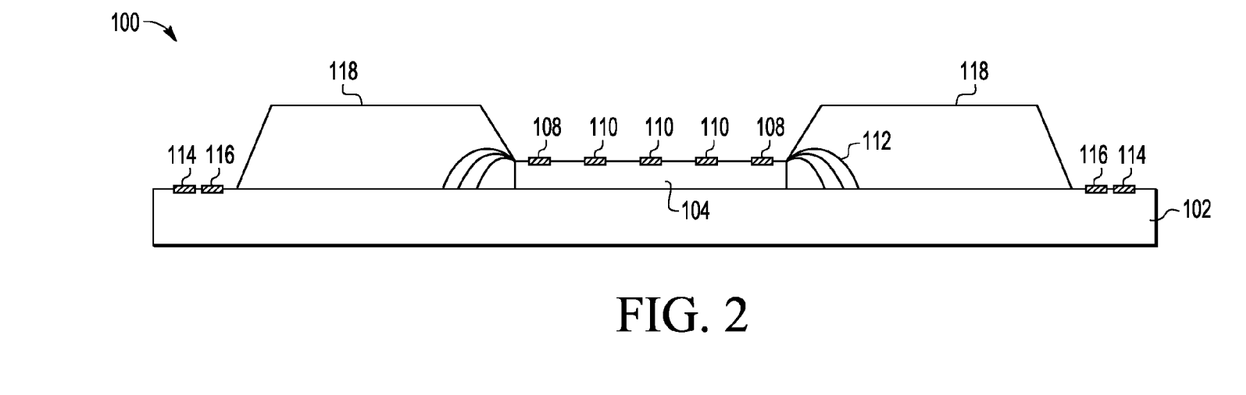
FIGS. 2-4 show the semiconductor device of FIG. 1 during other intermediate stages of manufacture.

Referring to FIG. 2, semiconductor device 100 is shown during another stage of manufacture in which mold compound 118 is formed over wire bonds 112, a perimeter region of the die 104, and a portion of the top surface of substrate 102. Mold compound 118 is not formed over ground contacts 110, 114 or power contacts 108, 116. Mold compound 118 can be formed using film assisted molding (FAM) or other suitable method that covers the electrical contacts between die 104 and substrate 102 while leaving contacts 108, 110, 114, 116 exposed. Any suitable mold compound 118 such as, but not limited to, an epoxy material filled with fused silica and other fillers or additives, can be used.

Figure 3:
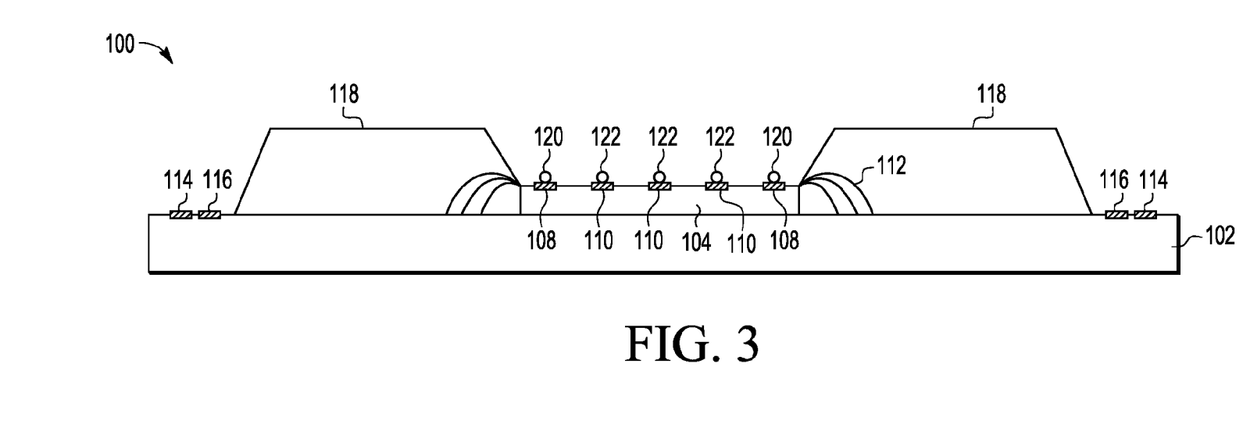

Referring to FIG. 3, semiconductor device 100 is shown during another stage of manufacture in which solder bumps 120 are formed on power contacts 108 and solder bumps 122 are formed on ground contacts 110. Although solder bumps 120, 122 are shown, other suitable conductive material can be used that softens during a reflow process or otherwise enables attachment to other components.

Figure 4:
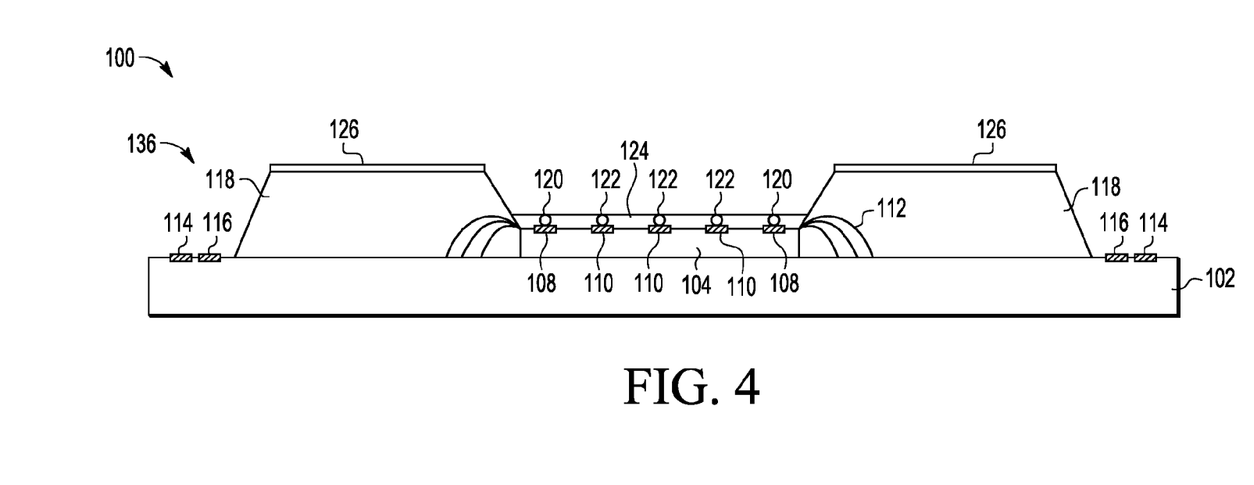

Referring to FIG. 4, semiconductor device 100 is shown during another stage of manufacture in which thermal interface material 124 is deposited over the top surface of die 104 and over and around solder bumps 120, 122. Adhesive material 126 is also deposited over the top surface of mold compound 118. Thermal interface material 124 can be a filled silicone gel material, a filled epoxy material, a filled grease, or other suitable non-electrically conductive material that is capable of withstanding subsequent assembly operations and operational conditions at expected temperatures and has desired heat transfer characteristics. Substrate 102, die 104, contacts 108, 110, 114, 116, wire bonds 112, mold compound 118, solder bumps 120, 122, thermal interface material 124, and adhesive material 126 form integrated circuit (IC) die assembly 136 that is ready to be joined with a heat spreader, as further described below.

Figure 5:
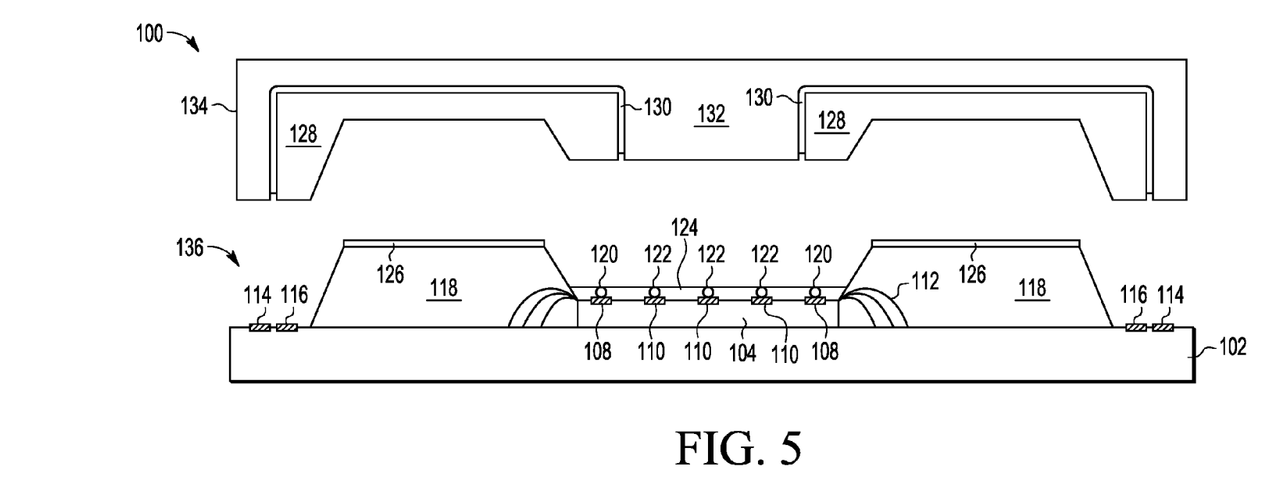
FIGS. 5-6 show the semiconductor device of FIG. 4 during other intermediate stages of manufacture during which an electrically conductive heat spreader is added.

Referring to FIG. 5, semiconductor device 100 is shown during another stage of manufacture in which an electrically conductive heat spreader 134 is shown with die assembly 136. Heat spreader 134 includes a first heat spreader portion 128, an insulating layer 130, and a second heat spreader portion 132. Insulating layer 130 separates first heat spreader portion 128 from second heat spreader portion 132. First and second heat spreader portions 128, 132 can be formed of electrically and thermally conductive material such as copper, copper alloys, aluminum, aluminum alloys, or other suitable material (s). First and second heat spreader portions 128, 132 do not have to be the same material or have the same thickness. For example, first heat spreader portion 128 can be a material selected to attenuate electromagnetic interference or other electrical characteristics while second heat spreader portion 132 can be a material selected to prevent or reduce warpage or other undesirable physical characteristic(s).

Insulating layer 130 can be formed of a dielectric material with a high dielectric constant with low signal loss or low dissipation factor to provide capacitance. Insulating layer 130 electrically isolates first heat spreader portion 128 from second heat spreader portion 132, and can also conduct heat from first heat spreader portion 128 and die 104 to second heat spreader portion 132. Adhesive material 126 is used to mechanically and/or thermally couple heat spreader 134 to die assembly 136.

Figure 6:
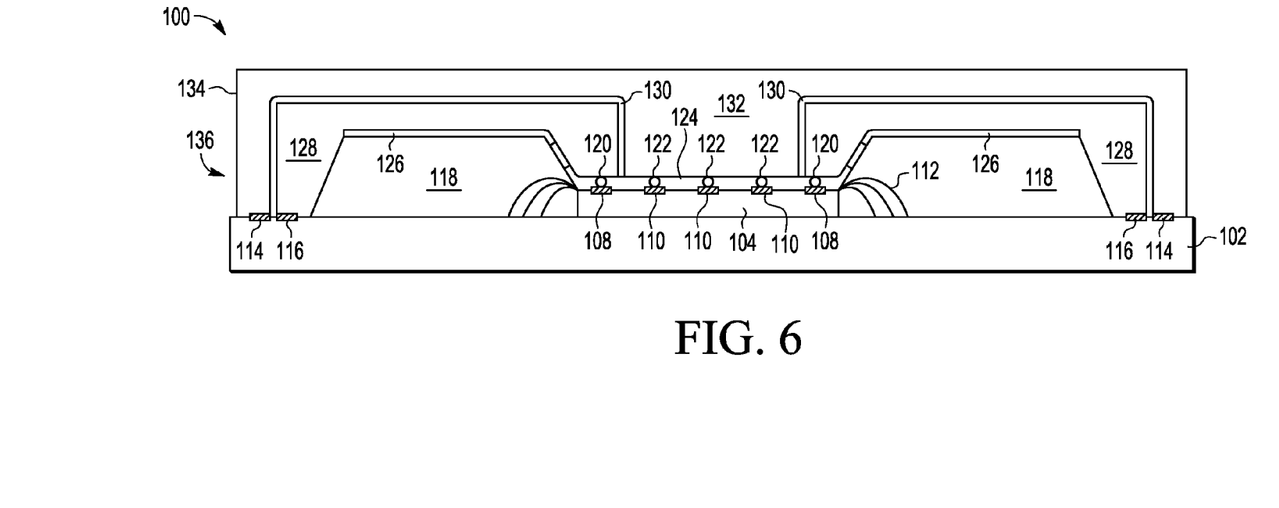

Referring to FIG. 6, semiconductor device 100 is shown during another stage of manufacture in which electrically conductive heat spreader 134 is attached to die assembly 136 using a reflow process or other suitable technique. First heat spreader portion 128 is attached to and extends between one or more bumps 120 on one edge of die 104 and one or more contacts 116 on substrate 102. Second heat spreader portion 132 is attached to and extends between one or more bumps 122 on an inner portion of die 104 and one or more ground contacts 114. In the embodiment shown, first heat spreader portion 128 is configured to contact adhesive material 126 to help retain heat spreader 134 on die assembly 136.

Figure 7:
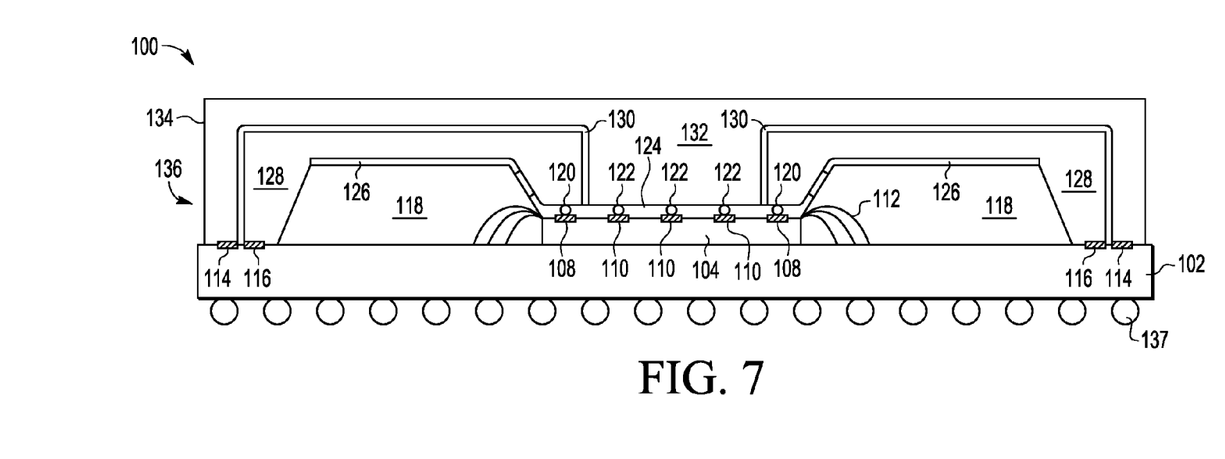
FIG. 7 shows a cross-sectional side view of an embodiment of a semiconductor device in accordance with the present invention.

FIG. 7 shows the semiconductor device 100 during another intermediate stage of manufacture in which electrical contacts such as solder balls 137 are formed on the bottom surface of substrate 102. For example, solder balls 137 can be configured as a ball grid array or other suitable electrically conductive structure that allows semiconductor device 100 to be attached to another structure such as a substrate (not shown) or another semiconductor device package (not shown).

Figure 8:
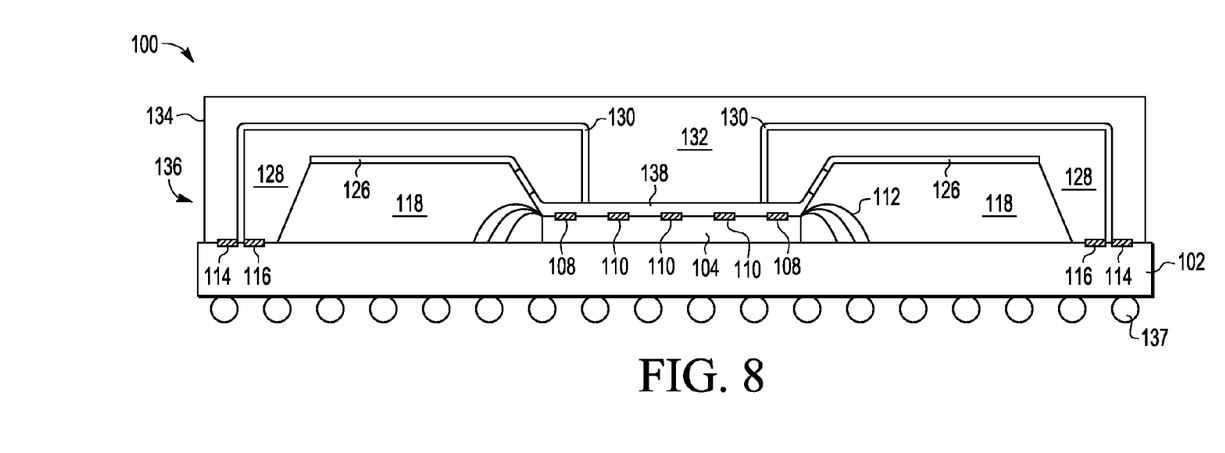
FIG. 8 shows a cross-sectional side view of another embodiment of a semiconductor device in accordance with the present invention.

FIG. 8 shows another embodiment of a semiconductor device 100 in accordance with the present invention in which anisotropic adhesive 138 is used on the top surface of die 104 instead of solder bumps 120, 122 (FIG. 6). Anisotropic adhesive 138 can be provided in a paste or flexible/semi-rigid film form, or other suitable form, for application to the top surface of die 104. In this embodiment, pads 108 and 110 can be raised above the surface of semiconductor die 104 by a specified height in order to press into the anisotropic adhesive 138 and form a narrower gap between the surface of pads 108, 110 than is formed between the surface of semiconductor die 104 and the opposing surfaces of first heat spreader portion 128 and second heat spreader portion 132. Anisotropic adhesive 138 can be a thermoset polymer resin with a filler of conductive metal particles of a controlled size distribution. The concentration and size of the conductive particles is chosen so that the particles contact one another in the direction of compression when adhesive 138 is compressed between raised pads 108, 110 to provide an electrically and thermally conductive path between die 104 and heat spreader 134. Additionally, the concentration and size of the conductive particles and the distance between power contacts 120 and ground contacts 122 are chosen so that the same particle does not bridge both contacts 120, 122.

To attach heat spreader 134 to die assembly 136, heat spreader 134 can be clamped to die assembly 136 and then heated in an oven until anisotropic adhesive 138 and adhesive 126 cures. Alternatively, a thermocompression seal can be formed with anisotropic adhesive 138 made with a snap cure resin that cures when heat spreader 134 is heated to a specified temperature and placed in contact with anisotropic adhesive 138. Adhesive 126 may be similarly cured.

Figure 9:
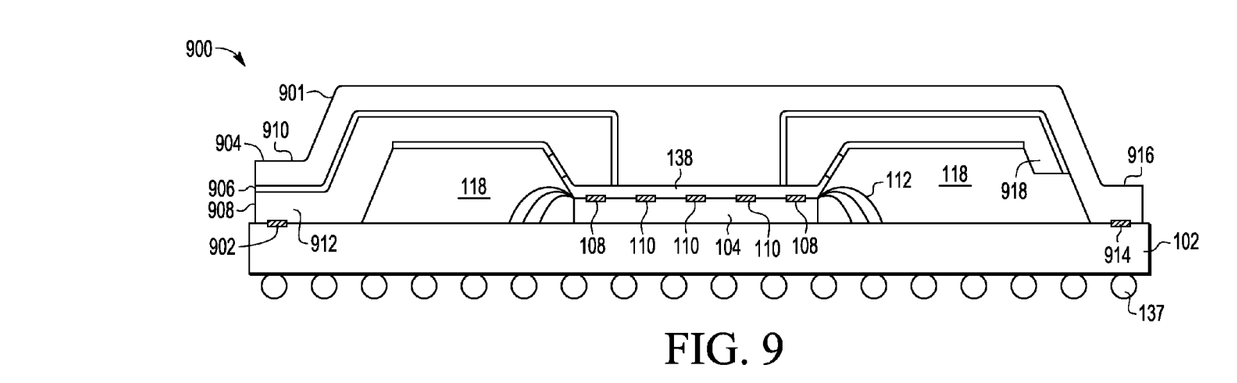
FIG. 9 shows a cross-sectional side view of another embodiment of a semiconductor device in accordance with the present invention.

FIG. 9 shows a side view of another embodiment of a semiconductor device 900 in accordance with the present invention in which heat spreader 901 includes power contact 902 on one side of substrate 102 and ground contact 914 on an opposite side of substrate 102. A first power portion 908 of heat spreader 901 includes a foot 912 that is attached to power contact 902 on the top surface of substrate 102. The remaining segment of power portion 908 extends across the top of mold compound 118 to power contact 108 on the top surface of die 104. A second power portion 918 of heat spreader 901 is attached to another power contact 108 on the opposite side of the top surface of die 104 but ends at an intermediate location adjacent the top surface of substrate 102 since there is no power contact at that particular location on the top surface of substrate 102 to connect to second power portion 918. Insulating material 906 is positioned between power portions 908, 918 and ground portion 904 of heat spreader 901.

Figure 10:
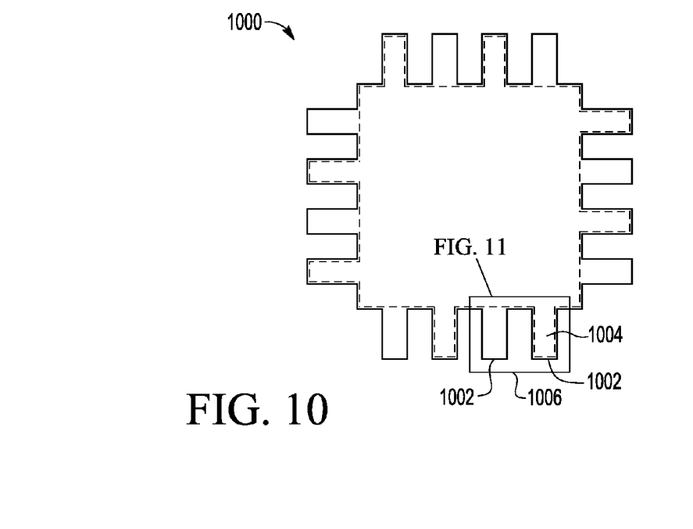
FIG. 10 shows a top view of an electrically conductive heat spreader in accordance with the present invention.

Based on FIG. 9, it is evident that power contacts 902 and ground contacts 914 can be placed at any desired locations on the top surface of substrate 102 with power portions 908, 918 and ground portion(s) 904 configured to contact respective power contacts 902 and ground contacts 914. As an example, FIG. 10 shows a top view of an embodiment of an electrically conductive heat spreader 1000 in accordance with the present invention that includes ground heat spreader fingers 1002 around the periphery of heat spreader 1000 and power heat spreader fingers 1004 (shown as dashed lines) under a subset of ground heat spreader fingers 1002. Other configurations with more or less power heat spreader fingers 1004 and ground heat spreader fingers 1002 can be used.

Note that although the embodiments shown and discussed herein include one layer of ground heat spreader portion 132 (FIG. 8), 910 (FIG. 9), 1002 (FIG. 10), insulating layer 130 (FIG. 8), 1008 (FIG. 11), and power heat spreader portions 128 (FIG. 8), 1004 (FIG. 10), additional layers of ground heat spreader portion 132 (FIG. 8), 910 (FIG. 9), 1002 (FIG. 10), insulating layer 130 (FIG. 8), 1008 (FIG. 11), and power heat spreader portions 128 (FIG. 8), 1004 (FIG. 10) can be used.

Figure 11:
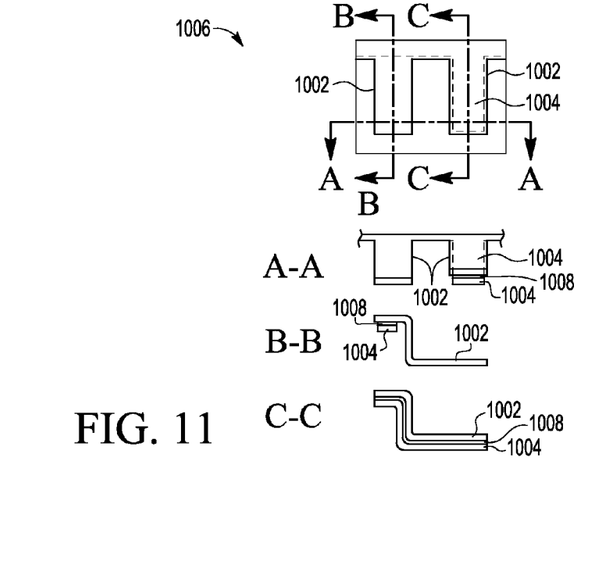
FIG. 11 shows top and side cutaway views of a portion of the heat spreader of FIG. 10.

FIG. 11 shows top and side cutaway views of a portion 1006 of heat spreader 1000 of FIG. 10 with one power heat spreader finger 1004 (shown as dashed lines) under one of two ground heat spreader fingers 1002. Cross-section A-A shows a side view of an outward-facing edge of ground heat spreader fingers 1002 and power heat spreader finger 1004. Cross-section B-B shows a side view through the middle of the length of a first ground heat spreader finger 1002 without power heat spreader finger 1004 underneath. Cross-section C-C shows a side view through the middle of the length of a second ground heat spreader finger 1002 with power heat spreader finger 1004 and insulating layer 1008 underneath. Ends of fingers 1002, 1004 closest to the center of spreader 1000 are bent vertically downward from the top surface of heat spreader 1006 at one end. The other end of fingers 1002, 1004 are bent in the horizontal plane away from the center of heat spreader 1000. As shown in cross-section B-B, power heat spreader finger 1004 can undercut ground heat spreader finger 1002 as shown so that power heat spreader finger 1004 is not exposed to the external environment. Note that ground heat spreader fingers 1002 that do not overlay a power heat spreader finger 1004 are bent further down the length of the finger 1002 to meet the top surface of the substrate.

Figure 12:
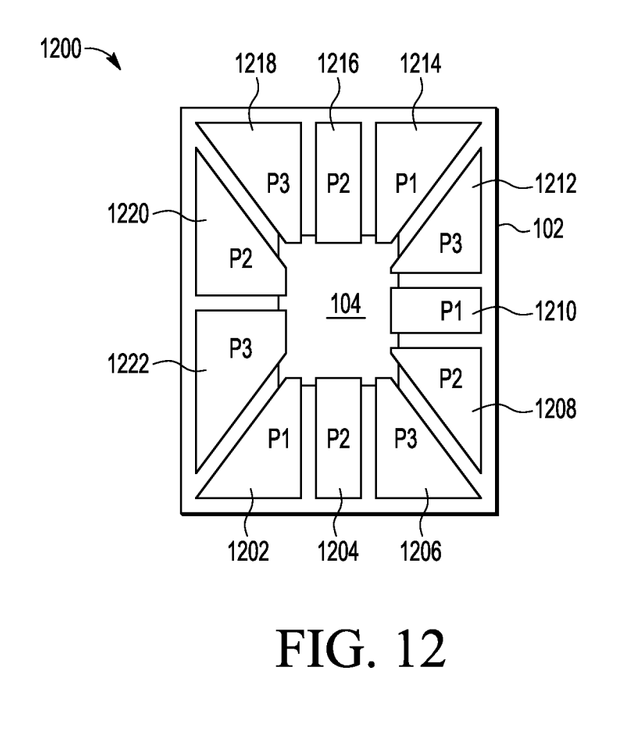
FIG. 12 shows a top cut away view of another embodiment of a semiconductor device in accordance with the present invention.

FIG. 12 shows a top view of another embodiment of a semiconductor device 1200 in accordance with the present invention in which a plurality of independent power heat spreader portions 1202-1222 are configured overlapping the outer periphery of die 104 and extending across a portion of the top of substrate 102. Mold encapsulant, such as mold encapsulant 118 in FIG. 8, can be formed on a portion of substrate 102 over wire bonds (not shown) between die 104 and substrate 102. Power heat spreader portions 1202-1222 can be positioned over the mold encapsulant. Power contacts, such as power contacts shown in 116 (FIG. 8), 902 (FIG. 9), can be formed on a substrate and connected to different power domains P1, P2, or P3. For example, one or more power contacts 116, 902 can be connected to a first power domain P1 at a specified voltage and one or more other power contacts can be connected to a second or third power domain P2 or P3 at different specified voltages. Each of power heat spreader portions 1202-1222 can be configured to contact only one of the power domains P1, P2, or P3 through the power contacts on the substrate.

Die 104 can include a plurality of power contacts (such as power contacts 108 in FIG. 6). The power from each spreader portion 1202-1222 is applied to a different power contact die 104. Electrical connections between spreader portions 1202-1222 and power contacts 108 can be made by solder bumps 120 (FIG. 7) or anisotropic adhesive 138 (FIG. 8). An insulating layer 130 (FIG. 7), 920 (FIG. 9) can be formed on and in physical contact with the top and side surfaces of power heat spreader portions 1202-1222. A single ground heat spreader portion (not shown) or multiple different ground heat spreader portions (not shown) corresponding to one or more power heat spreader portions 1202-1222 for the different power domains P1-P3 can be formed on the insulating layer 130 (FIG. 7), 920 (FIG. 9).

By now it should be appreciated that in some embodiments, a packaged semiconductor device 100 have been disclosed that can comprise a package substrate 102 that includes a first package substrate contact 116 or 902 and a second package substrate contact 114, 914. A semiconductor die 104 over the package substrate can comprise a first signal contact pad 108 and a second signal contact pad 110 in an inner region of a top surface of the semiconductor die. Each of the first and second package substrate contact pads can be laterally spaced apart from the semiconductor die. A plurality of electrical connections 112 can be included between the plurality of signal contact pads in the periphery region and the package substrate. A heat spreader 134 comprises a first heat spreader portion 128 which is electrically connected to the first signal contact pad 108 and the first package substrate contact 116 or 902 and provides an electrical conduction path between the first signal contact pad and the first package substrate contact and a thermal conduction path between the semiconductor die and package substrate. A second heat spreader portion 132 which is electrically connected to the second signal contact pad 110 and the second package substrate contact 114 or 914 provides an electrical conduction path between the second signal contact pad and the second package substrate contact and a thermal conduction path between the semiconductor die and package substrate. The second heat spreader portion completely covers the semiconductor die. An insulating layer 130 or 920 is included between the first and second heat spreader portion.

In another aspect, the packaged semiconductor device can comprise an interface layer 124, 138 between each of the first and second heat spreader portions and the semiconductor die, wherein the interface layer physically contacts a surface of the first heat spreader portion, a surface of the second heat spreader portion, and the top surface of the semiconductor die.

In another aspect, the interface layer comprises an anisotropic conductive material.

In another aspect, the packaged semiconductor device can comprise a solder material 120, 122 on each of the first and second signal contact pads, wherein the interface layer 124 comprises an electrically non-conductive material.

In another aspect, the surface of the second heat spreader portion is over a first region of the inner region of the top surface of the semiconductor die and the surface of the first heat spreader portion is over a second region of the inner region, wherein the second region surrounds the first region.

In another aspect, the surface of the second heat spreader portion and the surface of the first heat spreader portion collectively is in thermal contact through an interface layer 124, 138 with at least 20 percent of a total surface area of the top surface of the semiconductor die.

In another aspect, the semiconductor die can comprise a plurality of signal contact pads for 112 in a periphery region of the top surface of the semiconductor die which surrounds the inner region. The plurality of electrical connections can comprise wire bond connections 112.

In another aspect, the semiconductor die can comprise a molded encapsulant 118 over the package substrate and around the semiconductor die. The first heat spreader portion can be between the molded encapsulant and the second heat spreader portion.

In another aspect, the second heat spreader portion covers substantially all of a major surface of the first heat spreader.

In another aspect, the first signal contact pad is a first power supply contact pad for a first power supply voltage POWER and the second signal contact pad is a second power supply contact pad for a second power supply voltage GROUND, different from the first power supply voltage.

In other embodiments, a packaged semiconductor device can comprise a package substrate 102 comprising a first package substrate contact 114 or 914 and a second package substrate contact 116 or 902, and a semiconductor die 104 over the package substrate. The semiconductor die can comprise a first plurality of signal contact pads 110 in a first region of a top surface of the semiconductor die, and a second plurality of signal contact pads 108 in a second region of the top surface of the semiconductor die which surrounds the first region. Each of the first and second package substrate contact pads can be laterally spaced apart from the semiconductor die. A plurality of electrical connections 112 can be included between the semiconductor die and the package substrate. An interface layer 138 can be included on and in physical contact with the top surface of the semiconductor device. The semiconductor device can further comprise a heat spreader that includes a first heat spreader portion 132 which is electrically connected to the first plurality of signal contact pads 110 and the first package substrate contact 114 or 914 and provides an electrical conduction path between the first plurality of signal contact pads 110 and the first package substrate contact 114 or 914 and a thermal conduction path between the semiconductor die and package substrate. The first heat spreader portion can comprise a first surface which is in physical contact with the interface layer over the first region of the top surface of the semiconductor die. A second heat spreader portion 128 can be electrically connected to the second plurality of signal contact pads 108 and the second package substrate contact 116 or 902 and provide an electrical conduction path between the second plurality of second signal contact pads and the second package substrate contact and a thermal conduction path between the semiconductor die and package substrate. The second heat spreader portion can comprise a second surface which is in physical contact with the interface layer over the second region of the top surface of the semiconductor die. An insulating layer can be included between the first and second heat spreader portion.

In another aspect, the interface layer comprises an anisotropic conductive material.

In another aspect, the semiconductor device can further comprise a solder material 120, 122 on each of the first and second signal contact pads, wherein the interface layer comprises a electrically non-conductive thermal material.

In another aspect, the first surface of the first heat spreader portion and the second surface of the second heat spreader portion collectively covers at least 20 percent of a total surface area of the top surface of the semiconductor die.

In another aspect, the semiconductor device can further comprise a molded encapsulant 118 over the package substrate around the semiconductor die, wherein the second heat spreader portion is between the molded encapsulant and the first heat spreader portion.

In another aspect, the semiconductor device can further comprise a third plurality of contact pads for 112 in a periphery region of the top surface of the semiconductor die which surrounds the second region, wherein the plurality of electrical connections 112 are between the third plurality of contact pads and the package substrate, and wherein the molded encapsulant is over the plurality of electrical connections and the third plurality of contact pads.

In another aspect, the first signal contact pad is a first power supply contact pad for a first power supply voltage and the second signal contact pad is a second power supply contact pad for a second power supply voltage, different from the first power supply voltage.

In another aspect, the package substrate comprises a third package substrate contact laterally spaced away from the semiconductor die, the semiconductor die comprises a fourth plurality of signal contact pads in the second region, and the heat spreader comprises a third heat spreader portion which is electrically connected to the fourth plurality of signal contact pads and the third package substrate contact and provides an electrical conduction path between the fourth plurality of second signal contact pads and the second package substrate contact and a thermal conduction path between the semiconductor die and package substrate. The third heat spreader portion can comprise a third surface which is in physical contact with the interface layer over the second region of the top surface of the semiconductor die.

In other embodiments, a method for forming a packaged semiconductor device, can comprise attaching a semiconductor die 104 over a package substrate. The package substrate 102 can comprise a first package substrate contact 114 or 914 and a second package substrate contact 116 or 902, and the semiconductor die can comprise a first plurality of signal contact pads 110 in a first region of a top surface of the semiconductor die, and a second plurality of signal contact pads 108 in a second region of the top surface of the semiconductor die which surrounds the first region. Each of the first and second package substrate contact pads can be laterally spaced apart from the semiconductor die. An interface layer 138 can be formed on and in physical contact with the top surface of the semiconductor device, and a heat spreader can be attached. The heat spreader can comprise a first heat spreader portion 132 that is electrically connected to the first plurality of signal contact pads 110 and the first package substrate contact 114 or 914 and provides an electrical conduction path between the first plurality of signal contact pads 110 and the first package substrate contact 114 or 914 and a thermal conduction path between the semiconductor die and package substrate. The first heat spreader portion can comprise a first surface which is in physical contact with the interface layer over the first region of the top surface of the semiconductor die. A second heat spreader portion 128 which is electrically connected to the second plurality of signal contact pads 108 and the second package substrate contact 116 or 902 provides an electrical conduction path between the second plurality of second signal contact pads and the second package substrate contact and a thermal conduction path between the semiconductor die and package substrate. The second heat spreader portion can comprise a second surface which is in physical contact with the interface layer over the second region of the top surface of the semiconductor die. An insulating layer can be included between the first and second heat spreader portion.

In another aspect, prior to attaching the heat spreader, the method can further comprise forming a molded encapsulant 118 over the package substrate around the semiconductor die. After attaching the heat spreader, the second heat spreader portion can be between the molded encapsulant and the first heat spreader portion.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device, comprising:
    a package substrate comprising a first package substrate contact and a second package substrate contact;
    a semiconductor die over the package substrate, the semiconductor die comprising a first signal contact pad and a second signal contact pad in an inner region of a top surface of the semiconductor die, wherein each of the first and second package substrate contacts is laterally spaced apart from the semiconductor die;
    a plurality of electrical connections between a plurality of signal contact pads in a periphery region of the semiconductor die and a corresponding plurality of package substrate contacts on the package substrate; and
    a heat spreader comprising:
        a first heat spreader portion which is electrically connected to the first signal contact pad and the first package substrate contact and provides an electrical conduction path between the first signal contact pad and the first package substrate contact and a thermal conduction path between the semiconductor die and package substrate;
        a second heat spreader portion which is electrically connected to the second signal contact pad and the second package substrate contact and provides an electrical conduction path between the second signal contact pad and the second package substrate contact and a thermal conduction path between the semiconductor die and package substrate, wherein the second heat spreader portion completely covers the semiconductor die;
    an insulating layer between the first and second heat spreader portion;
    an interface layer between each of the first and second heat spreader portions and the semiconductor die, wherein
        the interface layer physically contacts a surface of the first heat spreader portion, a surface of the second heat spreader portion, and the top surface of the semiconductor die,
        the surface of the second heat spreader portion is over a first region of the inner region and the surface of the first heat spreader portion is over a second region of the inner region, wherein the second region surrounds the first region, and
        the surface of the second heat spreader portion and the surface of the first heat spreader portion collectively is in thermal contact through an interface layer with at least 20 percent of a total surface area of the top surface of the semiconductor die.

2. The packaged semiconductor device of claim 1, wherein the interface layer comprises an anisotropic conductive material.

3. The packaged semiconductor device of claim 1, further comprising:
    a solder material on each of the first and second signal contact pads, wherein the interface layer comprises an electrically non-conductive material.

4. The packaged semiconductor device of claim 1, wherein the plurality of signal contact pads in the periphery region of the semiconductor die surrounds the inner region, and wherein the plurality of electrical connections comprise wire bond connections.

5. The packaged semiconductor device of claim 1, further comprising:
    a molded encapsulant over the package substrate and around the semiconductor die, wherein the first heat spreader portion is between the molded encapsulant and the second heat spreader portion.

6. The packaged semiconductor device of claim 1, wherein the second heat spreader portion covers substantially all of a major surface of the first heat spreader.

7. The packaged semiconductor device of claim 1, wherein the first signal contact pad is a first power supply contact pad for a first power supply voltage POWER and the second signal contact pad is a second power supply contact pad for a second power supply voltage GROUND, different from the first power supply voltage.

8. A packaged semiconductor device, comprising:
    a package substrate comprising a first package substrate contact and a second package substrate contact;
    a semiconductor die over the package substrate, the semiconductor die comprising a first plurality of signal contact pads in a first region of a top surface of the semiconductor die, a second plurality of signal contact pads in a second region of the top surface of the semiconductor die which surrounds the first region, wherein each of the first and second package substrate contact pads is laterally spaced apart from the semiconductor die;
    a plurality of electrical connections between the semiconductor die and the package substrate;
    an interface layer on and in physical contact with the top surface of the semiconductor device; and
    a heat spreader comprising:
        a first heat spreader portion which is electrically connected to the first plurality of signal contact pads and the first package substrate contact and provides an electrical conduction path between the first plurality of signal contact pads and the first package substrate contact and a thermal conduction path between the semiconductor die and package substrate, wherein the first heat spreader portion comprises a first surface which is in physical contact with the interface layer over the first region of the top surface of the semiconductor die;
        a second heat spreader portion which is electrically connected to the second plurality of signal contact pads and the second package substrate contact and provides an electrical conduction path between the second plurality of second signal contact pads and the second package substrate contact and a thermal conduction path between the semiconductor die and package substrate, wherein the second heat spreader portion comprises a second surface which is in physical contact with the interface layer over the second region of the top surface of the semiconductor die; and
        an insulating layer between the first and second heat spreader portion, wherein the first surface of the first heat spreader portion and the second surface of the second heat spreader portion collectively covers at least 20 percent of a total surface area of the to surface of the semiconductor die.

9. The packaged semiconductor device of claim 8, wherein the interface layer comprises an anisotropic conductive material.

10. The packaged semiconductor device of claim 8, further comprising:

a solder material on each of the first and second signal contact pads, wherein the interface layer comprises a electrically non-conductive thermal material.

11. The packaged semiconductor device of claim 8, further comprising:
a molded encapsulant over the package substrate around the semiconductor die, wherein the second heat spreader portion is between the molded encapsulant and the first heat spreader portion.

12. The packaged semiconductor device of claim 11, wherein the semiconductor die further comprises and a third plurality of contact pads in a periphery region of the top surface of the semiconductor die which surrounds the second region, wherein the plurality of electrical connections are between the third plurality of contact pads and the package substrate, and wherein the molded encapsulant is over the plurality of electrical connections and the third plurality of contact pads.

13. The packaged semiconductor device of claim 8, wherein the first signal contact pad is a first power supply contact pad for a first power supply voltage and the second signal contact pad is a second power supply contact pad for a second power supply voltage, different from the first power supply voltage.

14. The packaged semiconductor device of claim 8, wherein:
the package substrate comprises a third package substrate contact laterally spaced away from the semiconductor die;
the semiconductor die comprises a fourth plurality of signal contact pads in the second region; and
the heat spreader comprises a third heat spreader portion which is electrically connected to the fourth plurality of signal contact pads and the third package substrate contact and provides an electrical conduction path between the fourth plurality of second signal contact pads and the second package substrate contact and a thermal conduction path between the semiconductor die and package substrate, wherein the third heat spreader portion comprises a third surface which is in physical contact with the interface layer over the second region of the top surface of the semiconductor die.

15. A method for forming a packaged semiconductor device, comprising:
attaching a semiconductor die over a package substrate, the package substrate comprises a first package substrate contact and a second package substrate contact, and the semiconductor die comprises a first plurality of signal contact pads in a first region of a top surface of the semiconductor die, a second plurality of signal contact pads in a second region of the top surface of the semiconductor die which surrounds the first region, wherein each of the first and second package substrate contact pads is laterally spaced apart from the semiconductor die;
forming an interface layer on and in physical contact with the top surface of the semiconductor device; and
attaching a heat spreader, the heat spreader comprising:
a first heat spreader portion which is electrically connected to the first plurality of signal contact pads and the first package substrate contact and provides an electrical conduction path between the first plurality of signal contact pads and the first package substrate contact and a thermal conduction path between the semiconductor die and package substrate, wherein the first heat spreader portion comprises a first surface which is in physical contact with the interface layer over the first region of the top surface of the semiconductor die;
a second heat spreader portion which is electrically connected to the second plurality of signal contact pads and the second package substrate contact and provides an electrical conduction path between the second plurality of second signal contact pads and the second package substrate contact and a thermal conduction path between the semiconductor die and package substrate, wherein the second heat spreader portion comprises a second surface which is in physical contact with the interface layer over the second region of the top surface of the semiconductor die; and
an insulating layer between the first and second heat spreader portion, wherein the first surface of the first heat spreader portion and the second surface of the second heat spreader portion collectively covers at least 20 percent of a total surface area of the to surface of the semiconductor die.

16. The method of claim 15, wherein prior to attaching the heat spreader, the method further comprises:
forming a molded encapsulant over the package substrate around the semiconductor die, wherein, after attaching the heat spreader, the second heat spreader portion is between the molded encapsulant and the first heat spreader portion.

* * * * *